Figure 1:
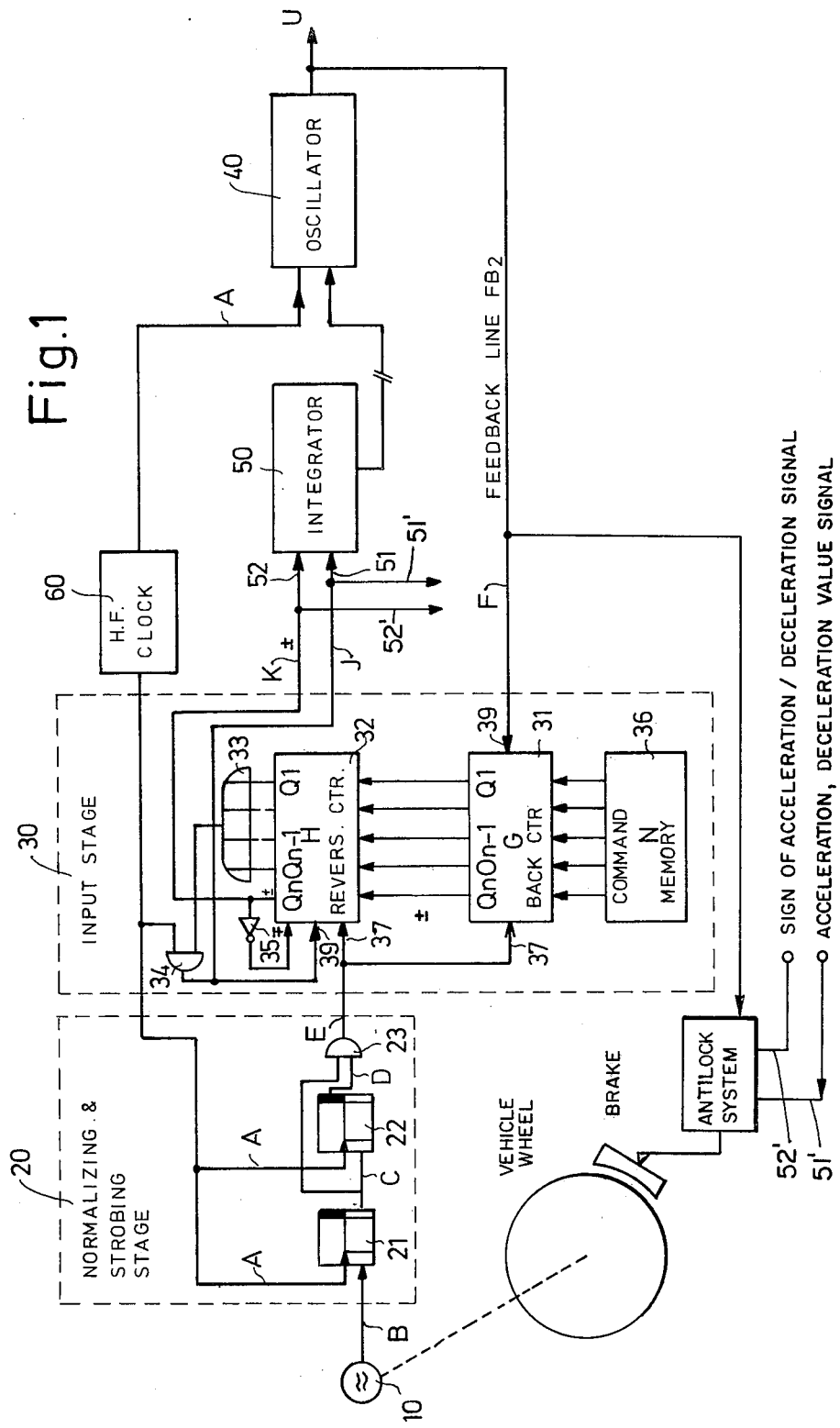

United States Patent [19]

Miller et al.

[11] 4,033,633
[45] July 5, 1977

[54] FREQUENCY CONTROL, AND SENSING CIRCUIT

[75] Inventors: Norbert Miller, Stuttgart; Peter Jurgen Schmidt; Bernd Przybyla, both of Schwieberdingen, all of Germany

[73] Assignee: Robert Bosch GmbH, Stuttgart, Germany

[22] Filed: Mar. 18, 1976

[21] Appl. No.: 668,296

[30] Foreign Application Priority Data

Mar. 22, 1975 Germany ............................ 2512738

[52] U.S. Cl. .............................. 303/97; 235/92 FQ; 235/92 NT; 235/92 AE; 303/95; 303/107; 361/242; 235/150.2
[51] Int. Cl.[2] ........................................... B60T 8/08
[58] Field of Search ................ 303/95, 96, 97, 107, 303/109; 235/92 FQ, 92 NT, 92 AE, 150.2, 151.32, 176, 177; 317/5

[56] References Cited

UNITED STATES PATENTS 3,674,318  7/1972  Hickner .............................. 303/97
3,840,277  10/1974  Bouthors .......................... 303/109
3,843,210  10/1974  Portas ................................. 303/97

Primary Examiner—Trygve M. Blix
Assistant Examiner—Reinhard J. Eisenzopf
Attorney, Agent, or Firm—Flynn & Frishauf

[57] ABSTRACT

An oscillator is connected to a backward counter to set the backward counter to a count number representative of its frequency of oscillation, the backward counter being stepped down by clock pulses recurring at a frequency high with respect to the cycling rate of the oscillator until it reaches a reference value, for example zero. The difference between the reference value and the count state of the counter when a predetermined counting period has elapsed, as determined by the duration of one cycle of the input signal, forms an error signal which is transmitted over a bi-directional counter to an integrator which, in turn, controls the oscillator. The system is particularly applicable for use in connection with vehicle wheel brake anti-lock arrangements, and permits determination of wheel speed by oscillation of the oscillator as well as acceleration and deceleration by sensing the error signal.

20 Claims, 2 Drawing Figures

FREQUENCY CONTROL, AND SENSING CIRCUIT

Cross reference to related patents:
U.S. Pat. Nos. 3,863,993, 3,840,278, 3,874,743, 3,883,754, 3,907,380, to all Fleischer et al; all assigned to the assignee of the present application.

The present invention relates to a frequency control circuit, and more particularly to such a circuit which includes a feedback connection in which an output signal derived from the circuit is compared with a reference to develop an error signal which is fed back to the input to provide a control signal to control the output frequency of the circuit.

A frequency control circuit which was previously proposed uses an integrator stage controlled by an oscillator. The input stage of the circuit used a frequency counter, a coincidence circuit and a flip-flop arrangement which are logically so interconnected that the timing of occurrence of coincidence of the counting state of the frequency counter with a count number provided as a command signal is compared with the time to the end of the counting interval. The time differences provide a measure for the required error signal. This known circuit requires a working cycle which must be somewhat longer than a highly accurate counting time. This counting time is usually controlled by a quartz-controlled oscillator. The increase in time — which may be termed dead time — is necessary because the error signal should be available even if the oscillator frequency is less than the frequency which is commanded. If substantially great deviations are to be controlled, then the dead time will be comparatively long in order to be able to determine coincidence at all. Alternatively, the error signal will be limited to a finite value which is so arranged that, if coincidence is not determined upon the next occurring control cycle, an error signal of constant value is applied to the integrating stage. This system, as proposed, is difficult to maintain stable; spurious swings and oscillations upon operation thereof, particularly when first initiating the control, can be avoided only with difficulty.

It has been found disadvantageous in many applications that the intervals in which the oscillator is controlled by the error signals are of unequal lengths. If the oscillator frequency is higher than the command frequency, control is effected towards the end of the counting time. If the oscillator frequency, however, is less than the command frequency, then control is effected each time upon occurrence of coincidence. Thus, the time when the error signal becomes effective is determined by the concidence with oscillator frequency. This point in time depends on the value and direction of deviation of the actual frequency from the command frequency — in other words, on the sign and intensity of the command signal. The point in time of control thus will occur between the end of the counting cycle and start of a new cycle. The speed of control is not uniform in such a system.

It is an object of the present invention to provide a frequency control circuit which permits rapid control of frequency and does not have the disadvantages of the prior art; and, further, to provide a system which is particularly adapted for use in vehicle brake anti-lock systems to determine vehicle speed and vehicle acceleration by counting and determining the rate of occurrence of signals derived from a transudcer in the vehicle.

Subject matter of the Present Invention Briefly, an input stage is provided to which the frequency to be controlled is applied. The number of oscillations of the output signals within a predetermined counting interval is determined. The error signal is derived by determining the difference between the number of oscillations and a predetermined command value at the time of termination of the counting interval.

The primary difference between the system in accordance with the present invention and the system as previously proposed thus resides in the timing of determination of the error signal and, consequently, its nature. In the known system, the time difference between coincidence and the end of the timing interval is determined; in contrast, the present invention utilizes a system in which a fixed point in time, uniform for each cycle, is selected and the count state of the counter is determined at that fixed point in time, which count state is then used to determine the magnitude as well as sign of the error signal. Thus, the system of the present invention does not require coincidence. The counting interval will always coincide with the operating cycle so that within normal range of frequencies no oscillations will occur when the system is started up and reaches self-control. The counting intervals, or counting cycles, all will have the same length. The error signals used for control thus will re-occur in uniform intervals. The speed of control is thus independent of the magnitude of deviation of the actual frequency from the command frequency.

The invention will be described in connection with a frequency control circuit developed for a vehicle brake anti-lock system. The invention is not limited to this application, however, and can be employed for various uses.

Figure 2:
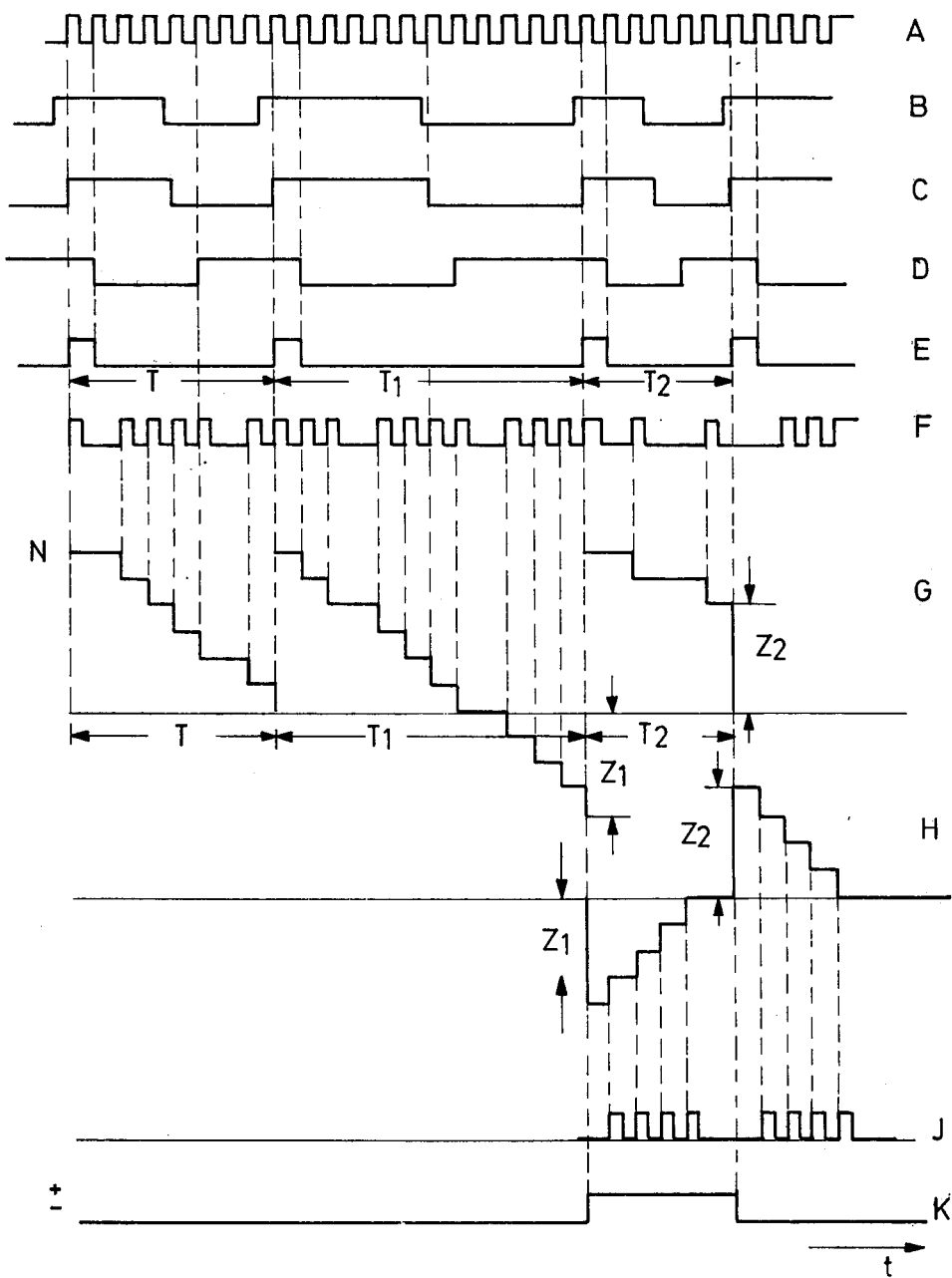

The invention will be described by way of example with reference to the accompanying drawings, wherein:

FIG. 1 is a schematic block circuit diagram of a frequency control circuit in accordance with the present invention; and FIG. 2, in graphs A to K, is a timing and pulse diagram, not to scale, for explanation of the operation of the system in accordance with the invention.

A pulse generator 10 (FIG. 1) which, for example, provides pulses in a sequence representative of rotary speed of the wheel of a vehicle is connected to a normalizing and strobing stage 20. The pulses are applied to an input stage 30. An oscillator 40 provides an output signal which is fed back over a feedback line FB. The oscillator 40 is controlled by an integrator 50. The output signal from oscillator 40 is applied to a utilization circuit, symbolically indicated by the arrow U. The system further includes a high-frequency clock generator 60 which controls the timing of the various elements, as will be explained.

Input stage 30 includes a backward counter 31, a first reversible counter 32, logic gates 33, 34, 35, and a memory or storage unit 36 in which a command value N can be stored.

The integrator 50 is actually constructed as a forward-backward counter. Oscillator 40 can be considered to be a number-to-frequency transducer. The normalizing and strobing stage 20 uses two flip-flops (FF's) 21, 22 and an AND-gate 23.

Operation, with reference to FIG. 2, in which the letters in FIG. 1 refer to equally lettered graphs in FIG. 2 to indicate the signals at the respective lines or junctions: The signal A of the clock pulses derived from clock generator 60 is much higher than the frequency of the signal B which is derived from the revolution transducer 10. The graphs C, D and E show the signals behind the first FF 21, the second FF 22, and AND-gate 23. Comparing these signals in FIG. 2 will clearly show the operation of stage 20. The arrangement is so selected that positive flanks, that is, the rising flanks of the signal applied to the input stage 30 coincide, in time, with the positive or rising flanks of the clock frequency A derived from clock generator 60. The pulse duration of the signal applied to the input stage 30 will correspond to the pulse duration of the clock signal A.

The signal shown in graph E of FIG. 2 is applied to both the reversible counter 32 as well as to the backward counter 31 at the count input terminals 37 thereof. As seen in the diagram G of FIG. 2, which indicates the count state of the backward counter 31 in dependence on time, the positive flank of the input signals causes setting of the backward counter 31 a value which can be compared with the value N stored in the command memory 36. The reference value N, derived from the memory 36, is so selected that, whenever the count state 0 is reached, the oscillator frequency will be a predetermined multiple of the frequency of the input signal. The command value N thus provides a factor with which the input frequency is multiplied or raised to provide the output frequency, mathematically:

$$(f_F = N \cdot f_E) \tag{1}$$

The backward counter thus could be considered also as a frequency divider. Each positive flank of the input signal also causes transfer of the then present count state of the backward counter 31 to the forward-backward, or reversible counter 32.

The diagram G shows three possibilities. The first diagram at the left illustrates the case in which the oscillator frequency has the desired value, that is, the value desired by the command frequency. The next one illustrates the case in which the oscillator frequency is above that of the command frequency, and the third portion illustrates the case in which the oscillator frequency is less than the commanded frequency.

If the command frequency and the oscillator frequency are the same, then, at the initiation of the next counting cycle, as determined by the positive flank of the input signal, the count state will be exactly zero. This count state of zero will be obtained earlier than the next rising flank of the input signal E if the oscillator frequency is higher — second portion. This causes the backward counter 31 to continue to count until a count state Z1 will be present at the end of the counting interval. This count state will be available at the outputs $Q_1$ to $Q_n-1$, in numerical value. The last output $Q_n$ represents the sign. An error signal will be derived which decreases the oscillator frequency and, as a result, a lesser number of output pulses than in the preceding cycle will occur, strobed in accordance with the clock signal, which is clearly apparent from the diagram F. The third portion of the diagram G illustrates the case in which the count state zero is not reached at all — oscillator frequency less than command frequency — so that at the end of the time interval $T_2$ the count state Z2 of the counter is transferred to the reversible counter 32 with the appropriate sign.

The number which is stored in the reversible counter 32 is read-out pulses derived from clock generator 60 and transferred to the integrator stage 50 which, as noted, includes a reversible (forward-backward) counter. The logic gates ensure application of clock pulses A to the clock input terminal 39 of the counter 32 until the outputs $Q_1$ to $Q_n-1$ of counter 32 no longer have a 1-signal appear thereat. The number of these clock pulses is applied to the counting input 51 of the integrator stage 50. Simultaneously, the direction of count is applied to the sign input 52 of the reversible counter in the integrator 50, connected from the output $Q_n$ of the reversible counter 32. The forward-backward counter 32, the count state of which depends on time, as clearly appears from diagram H, is also determined by the clock pulses as indicated in graph J, the graph K being representative of the associated sign.

The error signal is the signal representative of the count state Z1, or Z2, respectively (see graph G, FIG. 2) which is supplied at the end of each counting cycle, or at the beginning of the next counting cycle T, respectively, as available in the backward counter 31 of the input stage 30. This error signal is then applied to the reversible counter 32.

The graphs of FIG. 2 further clearly show that the length of the counting interval conforms exactly to the respective cycling time of the input signal E. The quantities Z1, Z2, respectively, forming the error signals, represent quantities which are characteristic of the change of oscillator frequency relative to one cycling period. This, again, means that acceleration or deceleration of a vehicle can be determined if the frequency of the input signal corresponds to the speed of the vehicle.

1. The system has these advantages with respect to comparable systems which have previously been used: The input signal is filtered or analyzed, over the entire input frequency range, with a uniform filter the constant, since the magnitude of the error signal is relative to the cycling time or duration of cycles or periods of the input signal. Thus, a rapid, cyclical start-up, appropriate to a filter of first order, is ensured.

2. The time constant can be held very short since, with respect to the system referred to in the introduction, dead time between the end of a counting and the termination of a working cycle is eliminated.

3. The command value N in the command memory 36 can readily be changed. By changing the value, a factor can be set, simply, with which the input frequency is to be multiplied. This substantially increases the accuracy of control, and thus decreases the quantitizing error in the subsequent utilization circuit, connected to the terminal U. The accuracy of response of the utilization circuit can thus be matched to the accuracy of supplied signals, which is determinable.

4. The count input 51 of the integrator 50 has a signal applied thereto, the number of the pulses of which is a measure for the acceleration (or deceleration) if the system is applied to a vehicle brake anti-lock system and available on an acceleration-deceleration value line 51'; otherwise, the number of pulses from terminal 51 is representative of the rate of change of input singals. The sign terminal 52 has a signal applied thereto which determines whether the rate of change is increasing or decreasing, that is, when applied to a brake anti-lock system, if the vehicle is accelerating or decelerating. This signal is available on an acceleration/deceleration sign line 52'. The output from the integrator 50 is representative of the input frequency, and thus is representative of the speed of the vehicle.

Many changes can be made in the circuit arrangement without departing from the principle of the present invention. For example, the command value can be obtained from a count state which is other than zero; any desired count state may be used. The pulses applied to the counting input 39 of the counter 31 can also be counted upwardly from any desired reference value. The difference of the count state at the next count interval with the number commanded by the command number in the memory can then be used as the next controlling error signal. This difference can be applied to the integrator 50 over an adder-subtracting stage as a numerical value, directly. It is not necessary to use digitally operating circuit components. For example, when using analog technology, the integrator 50 may be a capacitor, the charge voltage of which depends on the number of pulses applied within a certain time interval; the frequency of oscillator 40 will then be controlled by the voltage on integrator 50, so that oscillator 40 will operate as a voltage-frequency converter.

If the system operates entirely digitally — which is a preferred form when applied to automotive anti-lock use since it then becomes essentially immune to changes in supply voltage even if the supply voltage is not accurately regulated, then the following commercial elements may be used;

Flip-flops 21, 22: RCA CD 4013
counters 31, 32: RCA CD 4029
integrator 50: RCA CD 4029
memory 36: Intel 1702
numerically controlled oscillator 40: TI SN 7497 N.

Making the time of the counting interval proportional to the cyclical duration of the oscillator oscillations permits changing of the control response speed in such a manner that the time constant of control is essentially uniform for all frequencies, particularly with frequencies which are higher than the command frequency. This results in aperiodic initial, transient oscillations similar to those of a filter of first order. An additional advantage is obtained — important for some applications — viz. that the magnitude of the error signal is at the same time representative of the change of frequency, with respect to time. When using the system to be responsive to an input signal with variable frequency, then it will be desirable to use the time for each counting interval proportional to the cycling time of the input signal and to so change this time in a direction that the time of the counting interval corresponds to the cycling interval of the input signal. This meams that an error signal is derived during each period of the input signal, so that the follow-up control can be carried out particularly rapidly.

The circuit arrangement can be constructed with a minimum off economical components; in a preferred form, the oscillations of the output signal of the oscillator are summed in a counter which may be a single directional counter, that is, backward counter 31. The difference of the counter state with respect to a command signal in memory 36 is then determined at the beginning of any counting interval to provide an error signal, at which time the counter is also reset.

The beginning and the end of any counting interval are preferably determined by sensing sequential flanks of the input signal going in the same direction — for example, as shown, going upwardly. This ensures synchronous operation of the backward counter 31 with the input frequency.

Constructing the unidirectional counter 31 as a backward counter is a particularly preferred embodiment. This counter is set at a value at the beginning of each counting interval which is determined by the frequency of the output signal of the oscillator. The command or reference signal is the counter state zero. The actual state at the end of the counting interval will then be the error signal, so that the subsequently connected integrator can be rapidly reset and controlled. A full (bi-directional) adder can be used to add this counter state to the content of the integrator — with proper sign — which additionally provides for uniform control speed if the counting intervals are uniform. It is possible, however, to reduce the expense of the components used if extreme accuracy is not needed. In accordance with a feature of the invention, therefore, the count state of the unidirectional counter, that is backward counter 31, is transferred at the beginning of each counting cycle to the bi-directional counter 32, there processed by means of pulses from the clock 60 and transferred to integrator 50, also constructed to include a bi-directional counter, for example similar to reversible counter 32. The truncating error then depends on the ratio of clock frequency to input frequency; at customary values of 300 kHz to at the most 3 kHz, it will be extremely small.

The clock 60 is used not only to control the counters but additionally, in accordance with an advantageous and preferred form of the invention, provides for unambiguous, reliable evaluation of the pulses from the transducer 10 by strobing and normalizing the pulses, that is, by processing the output signal from transducers 10 and providing for synchronization with the clock pulses A. The pulse time duration of the various pulses of the input signal applied to the actual control circuit, that is, to the counter 31, will all have the same amplitude and the rising a well as the falling flanks of each pulse will coincide with the corresponding flanks of the clock pulses A from clock 60. This ensures proper timing of transfer of the counter state of the backward counter 31 to the reversible counter 32, as well as timing of the determination of the count state in the reversible counter 32. Additionally, this synchronization ensures that the count state of the backward counter 31 can be transferred to the reversible counter 32 only during the very small time period of one clock pulse cycle.

The system is particularly useful for such applications in which, in the past, phase control circuits were used, wherein and error signal was derived representative, in part, of the relative frequency position as well as of the phase position of two signals which were to be compared. In contrast to such phase control circuits, the system of the present invention does not provide for any phase control if the frequencies themselves coincide, even through a phase difference between the input signal and the command signal may be present. Consequently, the system is particularly suitable for vehicle wheel brake anti-lock systems in which pulses derived from wheel speed transducers must supply a signal which is only slightly filtered, proportional to wheel speed. This signal must, however, also be available for processing to obtain a signal representative of acceleration (or deceleration) of the vehicle. To obtain a sufficiently small filter time constant in such systems for the eventual utilization circuit, it is necessary that the frequency of the speed signal which is further used in the utilization circuit have a frequency which is substantially higher than the frequency supplied by the transducer itself. In customary systems, the actual output signal from transducer 10 will be in the order of between 100 Hz to 3000 Hz.

The time of the counting interval of the system is preferably so selected that it corresponds to the cycling duration of the input signal. The output of the first reversible counter 32 will then have a count state appear thereat which is representative of acceleration (or deceleration) of the vehicle. Due to the aforementioned aperiodic transient response of the signal proportional to the frequency, a quantity representative of acceleration (deceleration) will be obtained already even upon start-up, without transient errors. It is also possible to evaluate the pulse train or pulse sequence by reading out the state of the reversible counter 32.

The command number N in memory 36 provides a convenient reference number or reference level for the sign and value of the error signal which controls the integrator. The back counter 31, starting with this command or reference number N then compares this number N with the number of pulses A which are counted in succeeding intervals T, $T_1$, $T_2$ in dependence on the time duration of the cycling time of the input signal B, as is clearly apparent from the graph F. The time durations T, $T_1$, $T_2$ will be determined by succeeding positive-going flanks of the input signal, see graph E. The time duration between succeeding, positive-going flanks of the input signal, E, therefore, will control the difference Z1, Z2 in counting state (both in magnitude and sign) between the frequency of the input signal and the frequency of the signal derives from oscillator 40, this difference being transferred through reversible counter 32 to the integrator 50 to in turn control the oscillator 40. Assuming that the input signal E and the signal from oscillator 40 are in step, first portion of graph G during time period T, then a change in the input signal will cause, due to the error signal, a corresponding eventual change in the output signal of oscillator 40, so that the output signal from oscillator 40 will follow the input signal. In such application, the command or reference value N in memory 36 will remain constant.

We claim:

1. Frequency control circuit having an input signal (E) signal generating means (10, 20), means (36) providing a reference signal representative of a reference number (N), an input stage (30) having the input signal and the reference signal applied thereto, an oscillator (40) and an integrator (50) connected to and controlling the oscillation frequency of the ocillator, the output from the oscillator providing an output signal being fed back to the input stage (30) to provide, cyclically, an error signal to the integrator (50) by comparison in the input stage of said output signal with the reference signal and the input signal, wherein the input stage comprises means (31) connected to and controlled by the oscillator (40) determining the number of oscillations of the output signal from the oscillator (40) within a predetermined time period (T), said oscillation number determining means being further connected to and controlled by said reference means (36) and determining the difference (Z1, Z2) between said number of oscillations within the predetermined time period (T) and the reference number (N), and providing said error signal (J, K) representative of said difference upon elapse of said time period.

2. System according to claim 1, wherein said means (31) determining the number of oscillations of the output signal comprises a counter (31) determining said number by counting at a given rate within a predetermined counting time (T), which counting time is representative of said time period.

3. System according to claim 2, wherein said means determining the number of oscillations of the output signal comprises a counter (31) connected to and controlled by said oscillator and counting the number of oscillations of said oscillator (40) within the predetermined time period, said counter further being connected to and controlled by said reference means (36) and providing an output count number (Z1, Z2) of the count state of said counter with respect to the reference number (N) provided by said reference means as the counter (31) counts during said predetermined time period (T, T1, T2);

said difference (Z1, Z2) forming an error signal with respect to said reference number (N);

said counter (31) being reset upon beginning of each new counting time period (T).

4. System according to claim 3, wherein the time period (T) is variable and determined by the cycling time of at least one of: the oscillation of the oscillator (40); said input signal (E).

5. System according to claim 3, wherein said counter is connected to count as a unidirectional counter.

6. System according to claim 3, wherein the reference number, with respect to which the counter determines the difference, is the zero-state of the counter.

7. System according to claim 3, wherein the initiation and end of each counting cycle of the counter, corresponding to said predetermined time period (T), is sensed by sensing pulse flanks of the input signal (E).

8. System according to claim 7, wherein sequential similar-going pulse flanks of the input signal (E) determine initiation off a counting period and resetting of the counter.

9. System according to claim 3, wherein the counter (31) is a backward counter, the output signal from the oscillator (40), upon beginning of said time period (T) setting the counter to a counting state determined by the frequency of the output signal of the oscillator;

and wherein said reference number, with respect to which the counter determines the difference, is zero, the counter counting down and providing an error signal which is either greater than zero, zero, or a negative number.

10. System according to claim 9, further comprising a bi-directional counter (32) connected to and controlled by the counting state of the backward counter (31), said bidirectional counter (32) having the count state representative of the error signal transferred thereto upon beginning of each time period (T);

and means (33, 34, 35, 51, 52; 40, 60) connected to and controlling said bi-directional counter (32) to read the number stored therein representative of the error signal and apply a signal representative of said number to the integrator (50).

11. System according to claim 10, wherein the integrator comprises a reversible or bi-directional counter.

12. System according to claim 10, further comprising a clock generator (60) forming part of said read-out means connected to the reversible counter (32) and controlling transfer of the number in the bi-directional counter, representative of the error signal, to the integrator (50).

13. System according to claim 3, wherein the integrator comprises an adding means; and said error signal is transferred to said adding means to be algebraically added therein.

14. System according to claim 2, further comprising means responsive to change in the error signal in sequential time periods (T, T1, T2) to derive a signal representative of change in frequency of said input signal.

15. System according to claim 2, further comprising a clock generator (60) connected to said counter (31) and controlling the counting steps thereof;
and means (20) connected to said input signal and to said clock generator, to synchronize and normalize the input signal with respect to the clock pulses from the clock generator.

16. System according to claim 1, wherein the predetermined time period (T) is variable in acordance with the cycling time of oscillations of the oscillator (40).

17. System according to claim 1, whrein the input signal (E) is of variable frequency, said input signal being applied to the input stage (30);
an wherein said oscillator (40) is controlled to follow the change in frequency of said input signal, and wherein the time period (T) is variable in accordance with the cycling time of the input signal.

18. System according to claim 17, wherein said means (31) determining the number of oscillations of the output signals comprises a counter determining said number within said predetermined counting time, said predetermined counting time being the cycling time of the input signal (E).

19. System according to claim 1, wherein the input signal generating means comprises a rotary speed transducer element (10).

20. System according to claim 19, for use in a vehicle wheel brake anti-lock system, wherein said transducer is coupled to a vehicle wheel, the output signal from the oscillator or the output signal from the integrator is representative of wheel speed, and the error signal is representative of acceleration, and deceleration, respectively, of the wheel.

* * * * *